(12) United States Patent
Lin et al.

(10) Patent No.: US 12,366,794 B2
(45) Date of Patent: Jul. 22, 2025

(54) OPTICAL ENGINE DEVICE WITH HEAT DISSIPATION FUNCTION AND PROJECTOR THEREOF

(71) Applicant: BENQ CORPORATION, Taipei (TW)

(72) Inventors: Chun-Han Lin, Taipei (TW); Chen-Cheng Huang, Taipei (TW)

(73) Assignee: BenQ Corporation, Taipei (TW)

( * ) Notice: Subject to any disclaimer, the term of this patent is extended or adjusted under 35 U.S.C. 154(b) by 559 days.

(21) Appl. No.: 17/723,491

(22) Filed: Apr. 19, 2022

(65) Prior Publication Data

US 2023/0176460 A1 Jun. 8, 2023

(30) Foreign Application Priority Data

Dec. 6, 2021 (TW) .................................. 110145426

(51) Int. Cl.
*G03B 21/16* (2006.01)
*G03B 21/20* (2006.01)
*H05K 7/20* (2006.01)

(52) U.S. Cl.
CPC .......... *G03B 21/16* (2013.01); *G03B 21/204* (2013.01); *H05K 7/20145* (2013.01); *H05K 7/20172* (2013.01); *H05K 7/20209* (2013.01); *H05K 7/20445* (2013.01)

(58) Field of Classification Search
CPC .. G03B 21/16; G03B 21/204; G03B 21/2033; H05K 7/20145; H05K 7/20172; H05K 7/20209; H05K 7/20445

USPC ............................................................ 353/61
See application file for complete search history.

(56) References Cited

U.S. PATENT DOCUMENTS

| | | | |
|---|---|---|---|
| 2015/0092164 A1* | 4/2015 | Lin ...................... | G03B 21/204 353/57 |
| 2018/0143518 A1* | 5/2018 | Tsai .................... | G02B 27/0006 |
| 2020/0019047 A1* | 1/2020 | Lin ........................ | G02B 5/003 |
| 2020/0371415 A1* | 11/2020 | Arai ...................... | G03B 21/204 |
| 2020/0387056 A1* | 12/2020 | Du ......................... | G03B 33/08 |

FOREIGN PATENT DOCUMENTS

CN 201740962 U 2/2011
TW 201820018 A 6/2018

* cited by examiner

*Primary Examiner* — Magda Cruz

(57) ABSTRACT

An optical engine device with a heat dissipation function suitable for providing projection light of a projector includes a heat conductive casing, a phosphor wheel structure and a heat dissipation module. The phosphor wheel structure is disposed in the heat conductive casing. The heat dissipation module includes a channel member and a flow generation device. The channel member is disposed corresponding to the phosphor wheel structure in the heat conductive casing and has a guide channel and a nozzle extending from an outlet of the guide channel and facing a back side of the phosphor wheel structure. The flow generation device is connected to an inlet of the guide channel to generate an airflow flowing into the guide channel and passing through the nozzle for forming an impact flow toward the back side of the phosphor wheel structure.

6 Claims, 3 Drawing Sheets

OPTICAL ENGINE DEVICE WITH HEAT DISSIPATION FUNCTION AND PROJECTOR THEREOF

BACKGROUND OF THE INVENTION

1. Field of the Invention

The present invention relates to an optical engine device with a heat dissipation function and a projector thereof, and more specifically, to an optical engine device utilizing an impact flow to perform heat dissipation on a phosphor wheel structure and a projector thereof.

2. Description of the Prior Art

For a projector utilizing a phosphor wheel to generate color light, such as a laser projector, there is usually a heat dissipation module disposed in the projector for performing heat dissipation on a sealed optical engine device since internal heat energy is often accumulated in the sealed optical engine device. A conventional heat dissipation design is to attach a heat dissipation fin structure to a metal casing of the sealed optical engine device and utilize a heat dissipation fan to perform heat dissipation on the heat dissipation fin structure. Accordingly, the heat energy generated by the sealed optical engine device could be transmitted to the heat dissipation fin structure quickly via the metal casing and could be taken away by a heat dissipation airflow generated by the heat dissipation fan, so as to reduce a working temperature of the sealed optical engine device.

However, since the aforesaid heat dissipation design only indirectly transmits the heat energy out of the sealed optical engine device via the metal casing without directly performing heat dissipation on optical components (e.g., a phosphor wheel) in the sealed optical engine, it may cause the problem that excessively high temperatures of the optical components occur easily, so as to considerably influence the utilization safety, operational stability, and service life of the projector.

SUMMARY OF THE INVENTION

The present invention provides an optical engine device with a heat dissipation function suitable for providing projection light of a projector. The optical engine device includes a heat conductive casing, a phosphor wheel structure, and a heat dissipation module. The phosphor wheel structure is disposed in the heat conductive casing. The heat dissipation module includes a channel member and a flow generation device. The channel member is disposed corresponding to the phosphor wheel structure in the heat conductive casing. The channel member has a nozzle and a guide channel. The nozzle extends from an outlet of the guide channel and faces a back side of the phosphor wheel structure. The flow generation device is connected to an inlet of the guide channel to generate an airflow flowing into the guide channel and passing through the nozzle for forming an impact flow toward the back side of the phosphor wheel structure.

The present invention further provides a projector with a heat dissipation function. The projector includes a projector body and an optical engine device. The optical engine device provides projection light of the projector body. The optical engine device includes a heat conductive casing, a phosphor wheel structure, and a heat dissipation module. The phosphor wheel structure is disposed in the heat conductive casing. The heat dissipation module includes a channel member and a flow generation device. The channel member is disposed corresponding to the phosphor wheel structure in the heat conductive casing. The channel member has a nozzle and a guide channel. The nozzle extends from an outlet of the guide channel and faces a back side of the phosphor wheel structure. The flow generation device is connected to an inlet of the guide channel to generate an airflow flowing into the guide channel and passing through the nozzle for forming an impact flow toward the back side of the phosphor wheel structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
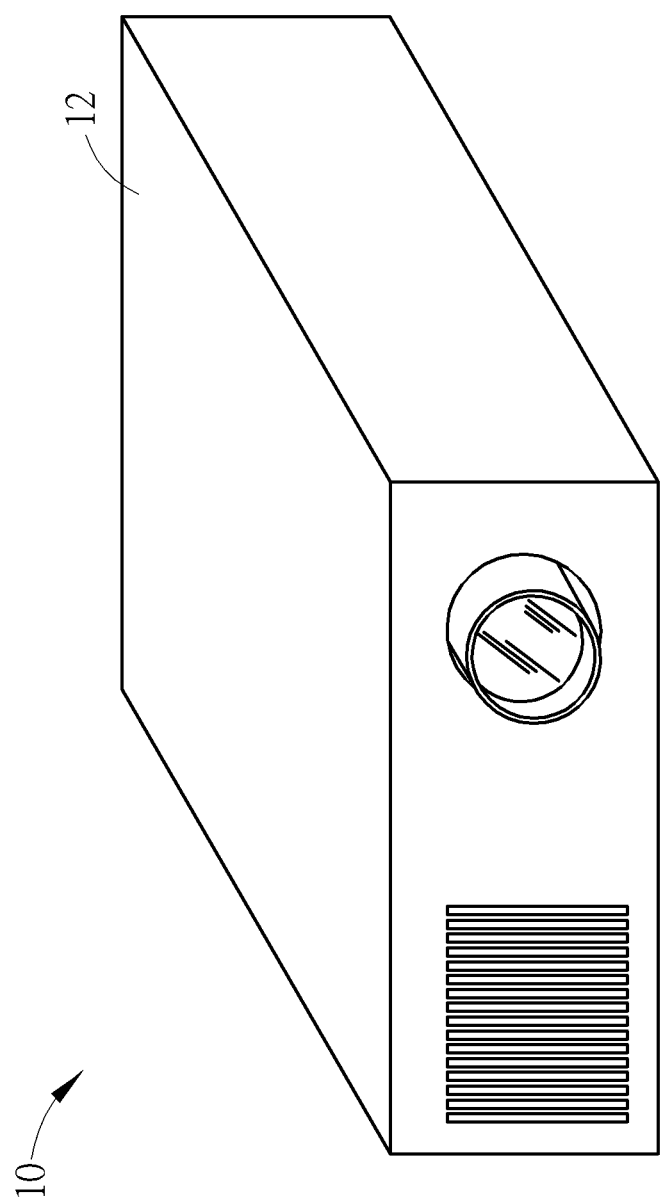
FIG. 1 is a diagram of a projector according to an embodiment of the present invention.
Figure 2:
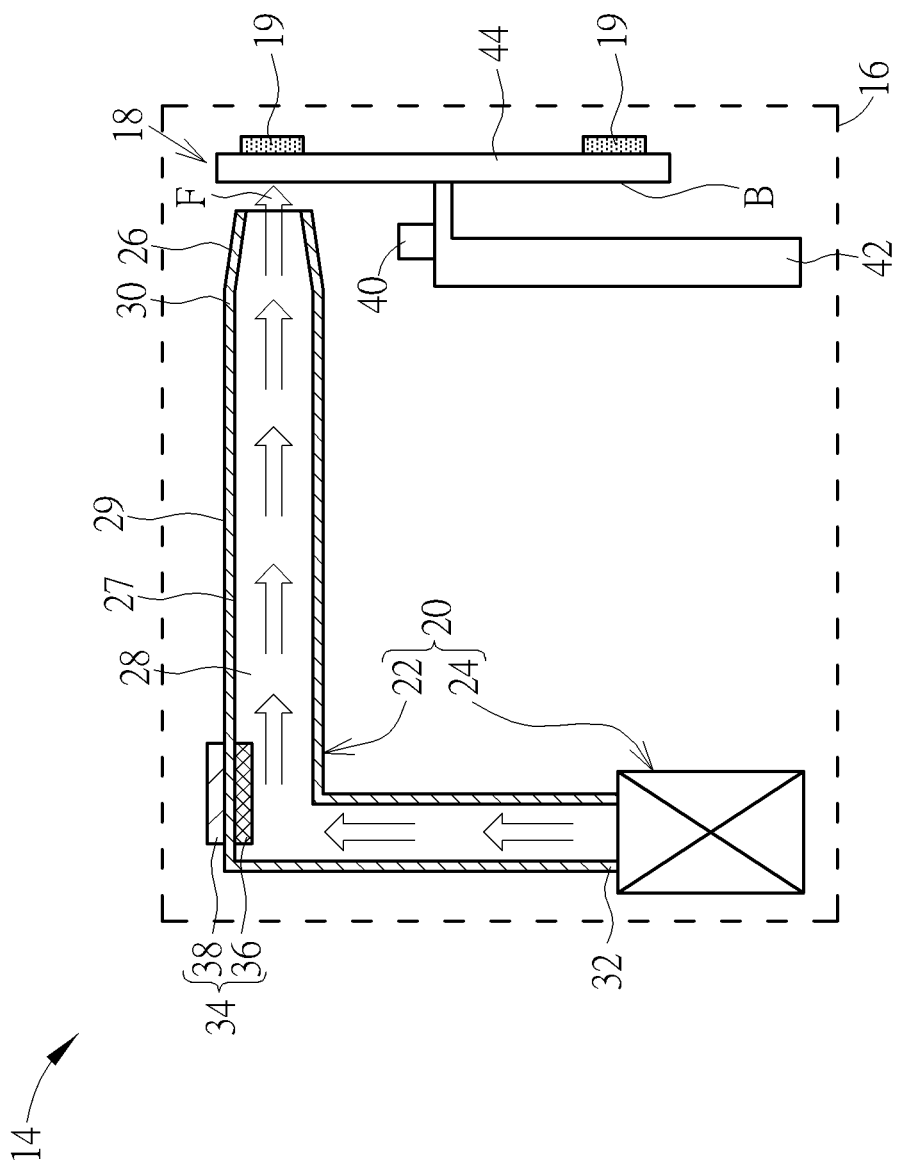
FIG. 2 is an internal diagram of an optical engine device in a projector body in FIG. 1.

Please refer to FIG. 1 and FIG. 2. FIG. 1 is a diagram of a projector 10 according to an embodiment of the present invention. FIG. 2 is an internal diagram of an optical engine device 14 in a projector body 12 in FIG. 1. As shown in FIG. 1 and FIG. 2, the projector 10 could be a conventional projector apparatus (e.g., a laser projector) utilizing a phosphor wheel to generate color light. The projector 10 includes the projector body 12 and the optical engine device 14. The projector body 12 could include major projector components disposed in a projector, such as a projector lens, a projector light source and a digital micromirror device (DMD), and the related description is commonly seen in the prior art and omitted herein.

The optical engine device 14 is disposed in the projector body 12 for providing projection light of the projector body 12. The optical engine device 14 includes a heat conductive casing 16 (e.g., a metal casing, but not limited thereto), a phosphor wheel structure 18, and a heat dissipation module 20, wherein the heat conductive casing 16 is depicted briefly by dotted lines in FIG. 2. The phosphor wheel structure 18 is disposed in the heat conductive casing 16. The heat dissipation module 20 includes a channel member 22 and a flow generation device 24 (e.g., a heat dissipation fan, but not limited thereto). The channel member 22 is disposed corresponding to the phosphor wheel structure 18 in the heat conductive casing 16 and has a nozzle 26 and a guide channel 28. The nozzle 26 extends from an outlet 30 of the guide channel 28 and faces a back side B of the phosphor wheel structure 18. The flow generation device 24 is connected to an inlet 32 of the guide channel 28. To be more specific, the phosphor wheel structure 18 could have at least one phosphor coating region 19 (two shown in FIG. 2, but not limited thereto), and the nozzle 26 is aligned with the back side B of the phosphor wheel structure 18 and corresponds to the phosphor coating region 19. As such, an airflow generated by the flow generation device 24 can flow into the guide channel 28 and pass through the nozzle 26 for forming an impact flow F toward the back side B of the phosphor wheel structure 18, so as to perform heat dissipation on a heat accumulation region (e.g., the phosphor coating region 19) of the phosphor wheel structure 18 by the jet impingement technology for efficiently improving the heat dissipation efficiency of the optical engine device 14.

For improving the heat dissipation efficiency of the heat dissipation module 20, the heat dissipation module 20 could further include a heat exchanger 34 preferably disposed in the guide channel 28. In this embodiment, as shown in FIG. 2, the heat exchanger 34 could preferably include a heat dissipation structure 36 and a thermoelectric cooling (TEC) chip 38. The heat dissipation structure 36 (preferably a heat dissipation fin structure, but not limited thereto) is disposed on an inner wall 27 of the guide channel 28 for performing heat dissipation on an airflow passing through the guide channel 28, and the thermoelectric cooling chip 38 is disposed corresponding to the heat dissipation structure 36 on an outer surface 29 of the guide channel 28, so as to quickly reduce a temperature of the airflow in the guide channel 28 for increasing the cooling efficiency of the impact flow F. As for the thermoelectric control design of the thermoelectric cooling chip 38, the related description is commonly seen in the prior art and omitted herein.

Figure 3:
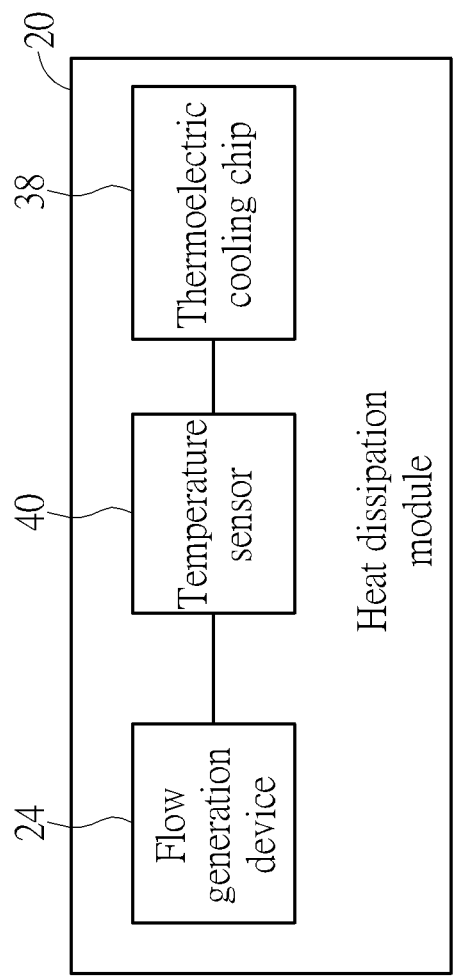
FIG. 3 is a temperature control functional block diagram of the optical engine device in FIG. 2.

In practical application, the present invention could further adopt a temperature sensing design. For example, please refer to FIG. 2 and FIG. 3. FIG. 3 is a temperature control functional block diagram of the optical engine device 14 in FIG. 2. As shown in FIG. 2 and FIG. 3, the heat dissipation module 20 could further include a temperature sensor 40. The temperature sensor 40 is disposed on the phosphor wheel structure 18 and is electrically connected to the thermoelectric cooling chip 38 and the flow generation device 24. To be more specific, in this embodiment, the phosphor wheel structure 18 could include a support frame 42 and a phosphor wheel 44. The support frame 42 is disposed in the heat conductive casing 16. The phosphor wheel 44 is rotatably connected to the support frame 42. The temperature sensor 40 could be preferably disposed corresponding to the phosphor wheel 44 on the support frame 42 (as shown in FIG. 2, but not limited thereto). Accordingly, the temperature sensor 40 can detect a temperature of the phosphor wheel structure 18 when the optical engine device 14 is working, and can adjust the heat dissipation efficiency of the thermoelectric cooling chip 38 and the flow generation device 24 according to the temperature. For example, when the temperature sensor 40 detects that the temperature of the phosphor wheel structure 18 is too high, the temperature sensor 40 could increase the cooling power of the thermoelectric cooling chip 38 and the output power of the flow generation device 24 for quickly reducing the temperature of the phosphor wheel structure 18. The related description of the circuit control design of the temperature sensor 40 for adjusting the heat dissipation efficiency of the thermoelectric cooling chip 38 and the flow generation device 24 is omitted herein since it is commonly seen in the prior art.

In summary, the present invention adopts the design that the flow generation device generates the airflow flowing into the channel member and passing through the nozzle of the channel member for forming the impact flow toward the back side of the phosphor wheel structure, so as to generate the direct heat dissipation effect. In such a manner, the present invention can efficiently solve the prior art problem that the excessively high temperatures of the optical components in the sealed optical engine device occur easily as the prior art only indirectly transmits the heat energy out of the sealed optical engine device via the metal casing. Thus, the present invention can greatly improve the utilization safety, operational stability, and service life of the projector.

It should be mentioned that the heat exchanging design of the present invention is not limited to the aforesaid embodiment. That is, all designs of using a heat exchanger to perform heat dissipation on related components (e.g., a heat conductive casing and a channel member) in an optical engine device could be adopted by the present invention. For example, the heat changer (e.g., a heat dissipation structure, a thermoelectric cooling chip or combination thereof) could be disposed on the outer surface of the heat conductive casing for transmitting the heat energy out of the heat conductive casing. In another embodiment, the heat dissipation structure could be disposed on the outer surface of the guide channel, and furthermore, the thermoelectric cooling chip could be disposed corresponding to the heat dissipation structure on the outer surface of the guide channel, so that the thermoelectric cooling chip could perform heat dissipation on the airflow passing through the guide channel cooperatively with the heat dissipation structure. In another embodiment, the heat exchanger could only include the thermoelectric cooling chip disposed on the inner wall or the outer surface of the guide channel for performing heat dissipation on the airflow passing through the guide channel. As for the related description for other derived embodiments (e.g., disposing the heat dissipation structure on the guide channel and disposing the thermoelectric cooling chip on the heat conductive casing), it could be reasoned by analogy according to the aforesaid embodiments and omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical engine device with a heat dissipation function suitable for providing projection light of a projector, the optical engine device comprising:
   a heat conductive casing;
   a phosphor wheel structure disposed in the heat conductive casing; and
   a heat dissipation module comprising:
      a channel member disposed corresponding to the phosphor wheel structure in the heat conductive casing, the channel member having a nozzle and a guide channel, the nozzle extending from an outlet of the guide channel and facing a back side of the phosphor wheel structure;
      a heat exchanger disposed on at least one of the guide channel and the heat conductive casing, the heat exchanger comprising:
         a heat dissipation structure disposed on an inner wall or an outer surface of the guide channel for performing heat dissipation on the airflow passing through the guide channel; and
         a thermoelectric cooling chip disposed corresponding to the heat dissipation structure on the outer surface of the guide channel;
      a flow generation device connected to an inlet of the guide channel to generate an airflow flowing into the guide channel and passing through the nozzle for forming an impact flow toward the back side of the phosphor wheel structure; and
      a temperature sensor disposed on the phosphor wheel structure and electrically connected to the thermoelectric cooling chip and the flow generation device, for detecting a temperature of the phosphor wheel structure and adjusting the heat dissipation efficiency of the thermoelectric cooling chip and the flow generation device according to the temperature.

2. The optical engine device of claim 1, wherein the phosphor wheel structure comprises a support frame and a phosphor wheel, the support frame is disposed in the heat conductive casing, the phosphor wheel is rotatably connected to the support frame, and the temperature sensor is disposed corresponding to the phosphor wheel on the support frame.

3. The optical engine device of claim 1, wherein the phosphor wheel structure has at least one phosphor coating region, and the nozzle is aligned with the back side of the phosphor wheel structure and corresponds to the at least one phosphor coating region to make the impact flow perform heat dissipation on the at least one phosphor coating region.

4. A projector with a heat dissipation function, the projector comprising:
   a projector body; and
   an optical engine device providing projection light of the projector body, the optical engine device comprising:
      a heat conductive casing;
      a phosphor wheel structure disposed in the heat conductive casing; and
      a heat dissipation module comprising:
         a channel member disposed corresponding to the phosphor wheel structure in the heat conductive casing, the channel member having a nozzle and a guide channel, the nozzle extending from an outlet of the guide channel and facing a back side of the phosphor wheel structure;
         a heat exchanger disposed on at least one of the guide channel and the heat conductive casing, the heat exchanger comprising:
            a heat dissipation structure disposed on an inner wall or an outer surface of the guide channel for performing heat dissipation on the airflow passing through the guide channel; and
            a thermoelectric cooling chip disposed corresponding to the heat dissipation structure on the outer surface of the guide channel;
         a flow generation device connected to an inlet of the guide channel to generate an airflow flowing into the guide channel and passing through the nozzle for forming an impact flow toward the back side of the phosphor wheel structure; and
         a temperature sensor disposed on the phosphor wheel structure and electrically connected to the thermoelectric cooling chip and the flow generation device, for detecting a temperature of the phosphor wheel structure and adjusting the heat dissipation efficiency of the thermoelectric cooling chip and the flow generation device according to the temperature.

5. The projector of claim 4, wherein the phosphor wheel structure comprises a support frame and a phosphor wheel, the support frame is disposed in the heat conductive casing, the phosphor wheel is rotatably connected to the support frame, and the temperature sensor is disposed corresponding to the phosphor wheel on the support frame.

6. The projector of claim 4, wherein the phosphor wheel structure has at least one phosphor coating region, and the nozzle is aligned with the back side of the phosphor wheel structure and corresponds to the at least one phosphor coating region to make the impact flow perform heat dissipation on the at least one phosphor coating region.

\* \* \* \* \*